United States Patent
Sato

(10) Patent No.: US 8,287,689 B2
(45) Date of Patent: Oct. 16, 2012

(54) PLASMA PROCESSING APPARATUS AND FEEDER ROD USED THEREIN

(75) Inventor: Kenji Sato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 696 days.

(21) Appl. No.: 12/408,837

(22) Filed: Mar. 23, 2009

(65) Prior Publication Data

US 2009/0242132 A1 Oct. 1, 2009

Related U.S. Application Data

(60) Provisional application No. 61/092,637, filed on Aug. 28, 2008.

(30) Foreign Application Priority Data

Mar. 25, 2008 (JP) ................................ 2008-077372

(51) Int. Cl.
 *H01L 21/00* (2006.01)
 *C23C 16/00* (2006.01)
 *C23C 14/00* (2006.01)

(52) U.S. Cl. ......... 156/345.28; 156/345.24; 156/345.25; 156/345.43; 156/345.44; 156/345.47; 118/712; 118/723 R

(58) Field of Classification Search ............. 156/345.28, 156/345.24, 345.25, 345.43, 345.44, 345.47; 118/712, 723 R
See application file for complete search history.

(56) References Cited

U.S. PATENT DOCUMENTS

2005/0095732 A1 5/2005 Maebashi et al.
2005/0270118 A1* 12/2005 Shannon ......................... 333/32

FOREIGN PATENT DOCUMENTS

JP 10-185960 7/1998
JP 2005-123578 5/2005

OTHER PUBLICATIONS

Korean Office Action issued on Jan. 11, 2011 in corresponding Korean Application No. 2009-0024485 (with an English Translation).

* cited by examiner

*Primary Examiner* — Ram N. Kackar
(74) *Attorney, Agent, or Firm* — Oblon, Spivak, McClelland, Maier & Neustadt, L.L.P.

(57) ABSTRACT

A feeder rod that transmits radio-frequency power via a matcher to a susceptor used in plasma generation that is disposed inside a processing chamber where a wafer undergoes a predetermined type of plasma processing, includes as an integrated part thereof electrical characteristics measurement probes. The integrated feeder rod unit can be detachably installed as a whole between the matcher and the processing chamber.

7 Claims, 6 Drawing Sheets

PLASMA PROCESSING APPARATUS AND FEEDER ROD USED THEREIN

CROSS-REFERENCE TO RELATED APPLICATIONS

This document claims priority to Japanese Patent Application Number 2008-077372, filed on Mar. 25, 2008 and U.S. Provisional Application No. 61/092,637, filed on Aug. 28, 2008, the entire content of which are hereby incorporated by reference.

FIELD OF THE INVENTION

The present invention relates to a plasma processing apparatus engaged in a specific type of plasma processing executed on a substrate with plasma generated from a gas inside a processing chamber by supplying radio-frequency power to an electrode within the processing chamber via a feeder rod and a feeder rod used in such a plasma processing apparatus.

BACKGROUND OF THE INVENTION

A plasma processing apparatus engaged in an etching process or a film forming process executed on a semiconductor wafer (hereafter may be simply referred to as a "wafer") with high-density plasma generated in a relatively low pressure environment is usually used in a semiconductor device manufacturing process. In a plane parallel plasma processing apparatus, for instance, a radio-frequency electrical field is formed between a pair of plane parallel electrodes (an upper electrode and a lower electrode) disposed within a processing chamber by delivering a processing gas into the processing chamber and supplying radio-frequency power to one of or both of the electrodes from an RF generator. Plasma is generated from the processing gas via the radio-frequency electrical field and the plasma thus generated is used in the specific type of processing executed on the wafer, such as etching or film formation.

A matcher that matches the input impedance at an electrode and the output impedance at the RF generator is disposed between the RF generator and the electrode. Via the matcher, the extent of reflection of the radio-frequency at the electrode can be minimized so as to ensure that plasma is efficiently generated within the processing chamber.

The power level, the voltage, the current and the load impedance (plasma impedance) of the radio-frequency power supplied to the electrode in such a plasma processing apparatus reflect the state of plasma generated within the processing chamber. Accordingly, by adjusting apparatus control parameters (hereafter referred to as "plasma parameters") related to the plasma generation based upon these electrical characteristics, the plasma generated within the processing chamber can be optimized and stabilized.

The plasma processing apparatus thus normally includes a probe disposed between the RF generator and the electrode, which is used to measure the electrical characteristics of the radio-frequency power supplied to the electrode, such as the radio-frequency current or the radio-frequency voltage (see, for instance, patent reference literature 1 below). The control device in this type of plasma processing apparatus is equipped with a data analyzing unit that analyzes voltage data or current data provided through the probe measurement. The data analyzing unit uses the measurement data provided from the probe to calculate, for instance, the time characteristics of the radio-frequency voltage and the radio-frequency current, the sizes of the radio-frequency power traveling wave and the reflected wave, the effective radio-frequency power, the load impedance and the like. Based upon the calculation results, the control unit adjusts the plasma parameters such as the flow rate of the processing gas delivered into the processing chamber, the degree of vacuum within the processing chamber, the level of the radio-frequency power output from the RF generator and the level of the capacitive reactance component at the matcher. Plasma optimized for the production processing conditions can be thus formed inside the processing chamber.

The plasma processing apparatus in the related art is normally fitted with a compact all-purpose probe unit provided as a unit separate from the plasma processing apparatus itself. In order to assure ease of mounting operation and efficient use of installation space, the probe unit may be housed inside the casing of the matcher by cutting off the radio-frequency transmission path within the circuit installed in the matcher. As an alternative, the probe unit may be mounted outside the matcher by inserting the probe unit in the radio-frequency transmission path (e.g., a coaxial cable or a feeder rod adopting an enclosed tube structure) connecting the matcher with the plasma processing apparatus (see patent reference literatures 1 and 2 below). In either case, the probe unit may be disposed between two separate segments of the radio-frequency transmission path or the probe unit may be disposed at a separate connector member used to connect the radio-frequency transmission path.

(Patent Reference Literature 1)
Japanese Laid Open Patent Publication No. 2005-123578 corresponding to U.S. Patent Publication No. 2005/0095732 A1
(Patent Reference Literature 2)
Japanese Laid Open Patent Publication No. 10-185960

Today, as ever higher levels of integration in semiconductor devices are pursued, increasingly fine circuit patterns are required in semiconductor devices. This necessitates extremely rigorous control to meet the required machining dimensional accuracy. In some applications, high-density plasma is generated in a lower pressure environment with radio-frequency power with a higher frequency supplied to the electrode inside the processing chamber to assure the required level of dimensional accuracy in finer circuit patterns.

However, as the frequency of the radio-frequency power supplied to the electrode increases, the state of the plasma formed inside the processing chamber becomes more susceptible to fluctuations attributable to the inductive reactance component at, for instance, a copper plate connecting components, a feeder rod connecting the matcher with the electrode or the like. This means that today more than ever, with the frequency of the radio-frequency power becoming even higher, it is crucial to measure the electrical characteristics of the radio-frequency power with better accuracy and adjust the plasma parameters with a higher level of precision.

It is essential that the measurement system including the probe be calibrated with a high level of accuracy to assure better accuracy in the measurement of the electrical characteristics of the radio-frequency power. Since it is difficult to calibrate the measurement system while it is actually connected to the plasma processing apparatus, the measurement system should be preferably calibrated before installing the probe unit at the plasma processing apparatus by creating a simulation environment simulating the electrical characteristics of the actual plasma processing apparatus and installing the probe unit alone in the simulation environment.

However, since the probe unit in the related art, provided as a separate entity from the radio-frequency transmission path, is disposed in the middle of the radio-frequency transmission path as described earlier, the electrical characteristics measured via the probe unit are bound to be affected by the mounting position at which the probe unit is mounted at the plasma processing apparatus. In other words, while the measurement system may be calibrated rigorously in the simulation environment created in conjunction with the probe unit alone, there still may be an error in a value measured via the probe unit mounted at the actual plasma processing apparatus. Furthermore, the extent of the error is bound to vary among individual plasma processing apparatuses. Depending upon the extent of the error in the measurement value, the corresponding plasma parameters may not be accurately adjusted and ultimately, the plasma may not be held in a desirable, stable state.

In addition, when the probe unit is inserted between two separate segments of the radio-frequency transmission path, as in the related art, the probe unit itself becomes a load component in the radio-frequency circuit, giving rise to a concern that power loss may occur at the insertion position. Furthermore, contact resistance, which is bound to occur at the position where the probe unit is connected, may also result in power loss. Under such circumstances, the radio-frequency power output from the RF generator will be greatly attenuated through the transmission path and, if the radio-frequency power supplied to the electrode is insufficient, plasma in the desired state will not be generated.

The radio-frequency transmission path is normally constituted with a transmission line assuming a co-axial structure such as a co-axial cable or a radio-frequency transmission line with a double-pipe structure. As the probe unit in the related art is inserted at such a co-axial transmission line, an error such as a probe unit mounting error or a mounting error with regard to the connector member used to mount the probe unit is bound to occur, making it very difficult to maintain a high precision co-axial structure. Such mounting errors and the like are likely to greatly alter the electrical characteristics in the transmission line.

Moreover, a probe unit housed inside the casing of the matcher, as described earlier, will need to be replaced when the matcher itself is replaced for maintenance or the like. It is more likely that measurement data continuity will be lost when the measurement of the electrical characteristics of the radio-frequency power is resumed following the matcher replacement. Such a loss of measurement data continuity gives rise to a concern that the quality of plasma generated after the matcher replacement may be different from that prior to the matcher replacement.

An object of the present invention, having been completed by addressing the issues discussed above, is to provide a plasma processing apparatus and a feeder rod used therein, with which the extent of power loss resulting from the probe installation can be greatly reduced, the inconsistency among measurement values obtained from various apparatuses, attributable to the probe mounting error, can be prevented and the probe measurement system can be calibrated with the probe assuming the mounted state in which it is actually engaged in operation, so as to ensure that the electrical characteristics of the radio-frequency power can be measured with a higher level of accuracy over the related art.

SUMMARY OF THE INVENTION

The object described above is achieved in an aspect of the present invention by providing a plasma processing apparatus comprising a processing chamber where a specific type of plasma processing is executed on a substrate by using a gas raised to plasma, a plasma generation electrode used to generate plasma, which is disposed within the processing chamber, an RF generator that generates radio-frequency power to be supplied to the electrode, a matcher that includes a matching circuit disposed between the electrode and the RF generator and set away from the processing chamber, which matches an input impedance at the electrode with an output impedance at the RF generator, a probing feeder rod constituted as an integrated unit that includes a probe used in electrical characteristics measurement and provided as part of a feeder rod via which the radio-frequency power having been generated at the RF generator and having traveled through the matching circuit is transmitted and supplied to the electrode. The whole probing feeder rod in the plasma processing apparatus is detachably mounted between the matcher and the processing chamber.

The object described above is also achieved in another aspect of the present invention by providing a feeder rod that transmits via a matcher radio-frequency power to an electrode used for plasma generation, disposed within a processing chamber where a specific type of plasma processing is executed on a substrate. A probe used in electrical characteristics measurement is provided as an integrated part at the feeder rod and the entire integrated unit made up with the feeder rod and the probe is detachably mounted between the matcher and the processing chamber.

According to the present invention described above, a probe is provided as an integrated part of the feeder rod that transmits the radio-frequency power from the RF generator to the electrode and the entire integrated unit made up with the feeder rod and the probe can be detachably mounted. Unlike the all-purpose probe unit in related art, the probe does not need to be inserted by dividing the radio-frequency transmission path at the feeder rod or in the matching circuit into separate segments. As a result, the extent of power loss can be greatly reduced over the related art that necessitates a special mounting operation to be performed in order to mount the probe itself and at the same time, any inconsistency among measurement values obtained from different plasma processing apparatuses, attributable to inconsistency in the probe mounting position or a mounting error, can be eliminated. Consequently, the radio-frequency power sustaining its electrical characteristics substantially intact can be transmitted to the electrode inside the processing chamber from the RF generator.

In addition, since the probing feeder rod according to the present invention can be disengaged as a whole, and thus, the probe measurement system can be calibrated for the probe remaining the integrated part of the feeder rod, i.e., in a state in which the probe is engaged in the actual operation. This means that once the calibration is completed, the probing feeder rod is simply installed at the plasma processing apparatus to measure the electrical characteristics of the radio-frequency power via the probe maintaining the calibrated state. As a result, the electrical characteristics can be measured with a higher level of accuracy over the related art. Since the plasma parameters can be adjusted accurately based upon such highly accurate measurement values, plasma in an even more desirable state can be generated with better stability.

Moreover, since the probe, provided as an integrated part of the feeder rod, is not mounted at the matcher. Thus, the probe is not replaced at the time of matcher replacement and the loss of data continuity with regard to the measurement value data provided via the probe does not occur at the time of the matcher replacement.

The object described above is achieved in another aspect of the present invention by providing a plasma processing apparatus comprising a processing chamber where a specific type of plasma processing is executed on a substrate by using a gas raised to plasma, a plasma generation electrode used to generate plasma, which is disposed within the processing chamber, a plurality of RF generators that generate radio-frequency power at different frequencies, a matcher that includes a plurality of matching circuits each disposed between the electrode and one of the RF generators, set away from the processing chamber, and engaged in impedance matching to match an input impedance at the electrode with an output impedance at the RF generator and a probing feeder rod constituted as an integrated unit that includes a probe used in electrical characteristics measurement and provided as an integrated part of a feeder rod via which superimposed radio-frequency power, obtained by superimposing the radio-frequency power with different frequencies having been generated at the individual RF generators and having traveled through the individual matching circuits, is transmitted and supplied to the electrode. The whole probing feeder rod in the plasma processing apparatus is detachably mounted between the matcher and the processing chamber. A filter circuit that allows only power with a specific frequency to be passed through may be installed at a radio-frequency output terminal of each matching circuit.

According to the present invention described above, a single detachable integrated unit of probing feeder rod, made up with the feeder rod and the probe, can be mounted at a plasma processing apparatus in which radio-frequency power at various frequencies originating from a plurality of RF generators, superimposed via a plurality of matchers, is supplied to a single electrode so that the superimposed radio-frequency power is transmitted via the probing feeder rod without compromising the electrical characteristics of the radio-frequency power transmitted via the feeder rod. In addition, the measurement of the electrical characteristics can be calibrated for the integrated unit made up with the feeder rod and the probe. This allows the electrical characteristics to be measured with a higher level of accuracy over the related art and the radio-frequency power sustaining its electrical characteristics substantially intact can be transmitted to the electrode inside the processing chamber from the RF generators.

It is to be noted that the feeder rod may adopt a coaxial double-pipe structure that includes a rod-shaped conductive member detachably connected between the radio-frequency output terminal (or a superimposed radio-frequency output terminal) of the matcher and the electrode and a tubular conductive member detachably connected at a ground potential between the matcher and a bottom portion of the processing chamber so as to enclose the exterior of the rod-shaped conductive member between the matcher and the bottom portion of the processing chamber. By providing the probe as an integrated part of the feeder rod adopting such a coaxial double-pipe structure it is ensured that unlike the all-purpose probe in the related art, which is mounted by dividing the feeder rod into separate parts, the probe is mounted with its axial center set in precise alignment and thus, no error attributable to such a mounting error occurs in the measurement values. Consequently, the electrical characteristics can be measured with a higher level of accuracy and the electrical characteristics of the radio-frequency power transmitted via the feeder rod do not deteriorate significantly.

The electrical characteristics representing one of; the voltage, the current, the effective power, the traveling wave, the reflected wave and the load impedance, of the radio-frequency power transmitted through the feeder rod may be measured via the probe or the electrical characteristics representing two or more among the voltage, the current, the effective power level, the traveling wave, the reflected wave and the load impedance of the radio-frequency power transmitted through the feeder rod may be simultaneously measured via the probe. The use of such a probe makes it possible to measure the electrical characteristics with a higher level of accuracy over the related art, which, in turn, makes it possible to adjust the plasma parameters with a higher level of accuracy, allowing formation of more desirable plasma with better stability.

It is desirable that one end of the probing feeder rod, connected on the processing chamber side, can be freely attached to/detached from a dummy load via a first calibration jig, that another end of the probing feeder rod connected to the matcher side, can be freely attached to/detached from the RF generator via a second calibration jig and that the probing feeder rod, with the probe remaining an integrated part thereof, can be connected between the dummy load and the RF generator when the probe measurement system is calibrated. These structural features allow the measurement achieved via the probe to be calibrated while the probe is attached to the feeder rod and the probing feeder rod as a whole to be disengaged once the calibration is completed, to be inserted between the matcher and the processing chamber. Thus, the measurement achieved via the probe can be calibrated for the probe forming the integrated part of the feeder rod, i.e., in a state in which the probe is actually engaged in operation.

It is also desirable that the probing feeder rod assume a characteristic impedance of 50Ω (ohm). Such a probing feeder rod allows the simulation environment in which the measurement achieved via the probe is calibrated by disengaging the probing feeder right from the plasma processing apparatus, to be configured entirely with all-purpose 50Ω cables and devices. It also eliminates the need for providing a special circuit for radio-frequency transmission path impedance matching. As a result, the measurement achieved by the probe can be calibrated quickly and accurately.

According to the present invention, a probe is provided as an integrated part of the feeder rod that transmits radio-frequency power from the RF generator to the electrode and the integrated unit constituted with the feeder rod and the probe can be mounted or disengaged as a whole, so as to greatly reduce the power loss occurring as a result of probe installation and prevent any inconsistency among measurement values obtained from individual apparatuses attributable to the probe mounting error. Furthermore, since the measurement achieved via the probe can be calibrated in the mounted state in which the probe is actually engaged in operation, the electrical characteristics of the radio-frequency power can be measured with a higher level of accuracy over the related art.

DETAILED DESCRIPTION OF THE PREFERRED EMBODIMENT

Figure 1:
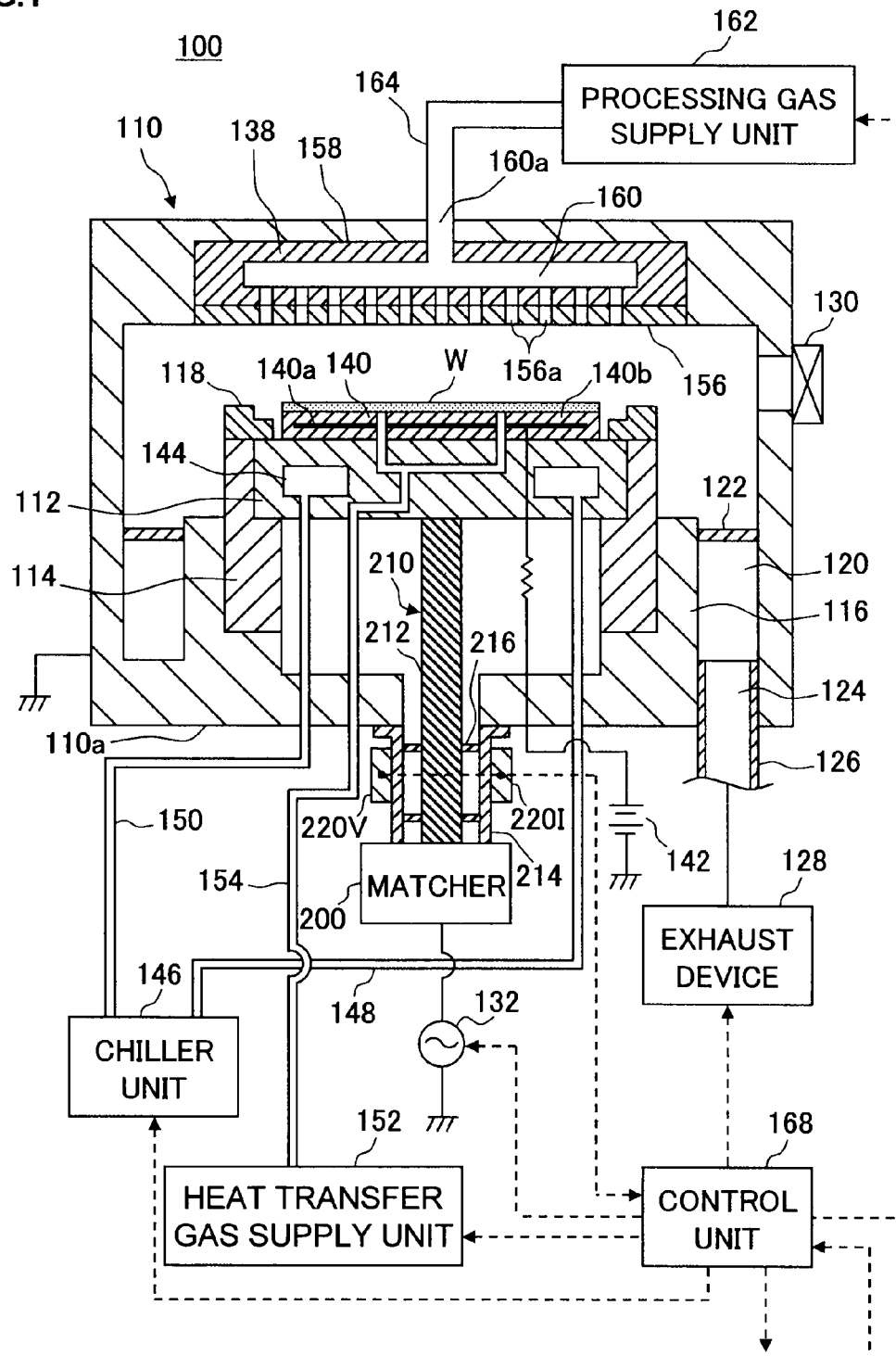
FIG. 1 is a longitudinal sectional view of a structural example that may be adopted in the plasma processing apparatus achieved in an embodiment.

The following is a detailed explanation of a preferred embodiment of the present invention, given in reference to the attached drawings. It is to be noted that in the description and the drawings, the same reference numerals are assigned to components assuming substantially identical functions or structural features so as to preclude the necessity for a reputed explanation thereof.

(Structural Example for the Plasma Processing Apparatus)

First, a structural example for the plasma processing apparatus that may be adopted in an embodiment of the present invention is described in reference to a drawing. FIG. 1 is a longitudinal sectional view schematically illustrating the structure of a plasma processing apparatus 100 achieved in the embodiment. As shown in FIG. 1, the plasma processing apparatus 100 is an RIE (reactive ion etching)-type plasma etching apparatus that includes an upper electrode and a lower electrode disposed parallel to each other so as to face opposite each other. It includes a cylindrical processing chamber 110 constituted of a metal such as aluminum or stainless steal. The casing of the processing chamber 110 is grounded and assumes the ground potential.

A disk-shaped susceptor 112, upon which a processing target substrate, e.g., a wafer W, is placed is disposed inside the processing chamber 110. The susceptor 112, which may be constituted of, for instance, aluminum, is supported by a tubular support member 116 extending from the bottom straight up inside the processing chamber 110 via a tubular holding member 114 with an insulating property. A focus ring 118 constituted of, for instance, quartz or silicon is disposed on the upper surface of the tubular holding member 114 so as to encircle the upper surface of the susceptor 112.

A ring-shaped gas discharge passage 120 is formed between the side wall of the processing chamber 110 and the tubular support member 116, with a ring-shaped baffle plate 122 mounted either at the entrance to or in the middle of the gas discharge passage 120 and an exhaust port 124 formed at the bottom of the gas discharge passage. An exhaust device 128 is connected to the exhaust port 124 via an exhaust pipe 126. The exhaust device 128, which includes a vacuum pump, is capable of depressurizing the processing chamber 110 to achieve a predetermined degree of vacuum therein. A gate valve 130 that opens/closes a transfer port via which the semiconductor wafer W is transferred, is mounted at the side wall of the processing chamber 110.

The susceptor 112, which also functions as a lower electrode, is electrically connected via a matcher 200 and a feeder rod 210 to an RF generator 132 that generates radio-frequency power to be used to generate plasma and attract ions. From the RF generator 132, radio-frequency power with a predetermined frequency, e.g., 60 MHz, is supplied to the susceptor 112.

The matcher 200 is installed between the susceptor 112 and the RF generator 132 over a distance from the processing chamber 110. It includes a matching circuit that matches the input impedance on the load side (the susceptor 112 in this case) and the output impedance on the RF generator side (the RF generator 132 in this case). The matching circuit may adopt a structure made up with, for instance, a coil/capacitor combination to achieve impedance matching. A radio-frequency input terminal of the matcher 200 is connected to a radio-frequency input terminal of the matching circuit, whereas a radio-frequency output terminal of the matcher 200 is connected to a radio-frequency output terminal of the matching circuit. The RF generator 132 is connected to the radio-frequency input terminal of the matcher and the feeder rod 210 is connected to the radio-frequency output terminal of the matcher.

In more specific terms, the feeder rod 210 may assume a coaxial double-pipe structure that includes a rod-shaped conductive member 212 that electrically connects the radio-frequency output terminal (not shown in FIG. 1) of the matcher 200 detachably to the susceptor 112 and a tubular conductive number 214 that is coaxial with the rod-shaped conductive member 212, and is electrically connected detachably between the matcher 200 and the bottom of the processing chamber 110 so as to enclose the exterior of the rod-shaped conductive member 212 between the matcher 200 and the bottom of the processing chamber 110. The rod-shaped conductive member 212 is fixed inside the tubular conductive member 214 via a plurality of (2 in this example) disk-shaped insulating members 216. While the rod-shaped conductive member fixed via such insulating members 216 is electrically insulated from the tubular conductive member 214, the position of the rod-shaped conductive member 212 relative to the tubular conductive member 214 is held firm with the insulating members so as to sustain a coaxial state with precision through connection/disconnection.

In addition, the feeder rod 210 in the embodiment is configured as a detachable integrated unit that includes the feeder rod and a probe constituting an integrated part thereof, which is used to measure the electrical characteristics of the radio-frequency power transmitted through the feeder rod 210. In other words, the feeder rod 210 achieved in the embodiment is a probing feeder rod. In the specific example presented in FIG. 1, the feeder rod includes a voltage probe 220V used for voltage measurement and a current probe 220I used for current measurement. The voltage probe 220V and the current probe 220I may both be disposed at the outer wall surface of, for instance, the tubular conductive member 214. Upon measuring the voltage and the current, the voltage probe 220V and the current probe 220I transmit the radio-frequency power voltage data and the radio-frequency power current data to a control unit 168 to be described in detail later. It is to be noted that the feeder rod 210 is to be also described in detail later.

A shower head 138, which also functions as an upper electrode, is mounted at the ceiling of the processing chamber 110. The showerhead 138 is grounded via the casing of the processing chamber 110 in the embodiment. It is to be noted that the showerhead 138 may adopt a structure other than that described above and an upper electrode matcher and an upper electrode RF generator (neither shown) may be connected to the showerhead 138 so as to supply radio-frequency power with a predetermined frequency originating from the upper electrode RF generator to the showerhead 138 via the upper electrode matcher.

The showerhead 138 includes an electrode plate 156 with numerous gas delivery holes 156a formed therein, constituting the lower surface of the shower head, and an electrode support member 158 that detachably supports the electrode plate 156. A buffer chamber 160 is formed inside the electrode support member 158, and a processing gas supply unit 162 is connected to a gas delivery port 160a at the buffer chamber 160 via a gas supply pipe 164.

As radio-frequency power originating from the RF generator 132 is supplied to the susceptor 112, a vertical radio-frequency electrical field corresponding to the voltage of the radio-frequency power is formed between the susceptor 112 and the showerhead 138. High-density plasma can be thus generated near the surface of the susceptor 112 via this radio-frequency electrical field.

In addition, an electrostatic chuck 140 that electrostatically attracts and holds the wafer W onto the susceptor 112 is disposed on the upper surface of the susceptor 112. The electrostatic chuck 140 includes an electrode 140a constituted of a conductive film within an insulating film 140b. The electrode 140a in the electrostatic chuck 140 may be held between a pair of insulating films, i.e., an upper insulating film and a lower insulating film. A DC power source 142 is electrically connected to the electrode 140a. The wafer W can be firmly held onto the susceptor 112 with the Coulomb force generated as a DC voltage is applied from the DC power source 142 to the electrostatic chuck 140.

A ring-shaped cooling chamber 144 ranging along, for instance, the circumferential direction is formed inside the susceptor 112. A coolant sustaining a predetermined temperature, e.g., cooling water, supplied from a chiller unit 146 via pipings 148 and 150 circulates through the cooling chamber 144. With the coolant sustaining the predetermined temperature, the processing temperature at which the semiconductor wafer W on the electrostatic chuck 140 is processed can be controlled. In addition, a heat transfer gas such as He gas, originating from a heat transfer gas supply unit 152 is supplied via a gas supply pipe 154 to the space between the upper surface of the electrostatic chuck 140 and the rear surface of the semiconductor wafer W.

The control unit 168 controls the operations of the various units in the plasma processing apparatus 100, including the exhaust device 128, the RF generator 132, the chiller unit 146, the heat transfer gas supply unit 152 and the processing gas supply unit 162. In addition, based upon the radio-frequency power voltage data and the radio-frequency power current data provided from the voltage probe 220V and the current probe 220I having measured the voltage and the current, the control unit 168 executes data processing (arithmetic processing) to calculate, for instance, the effective radio-frequency power and the load impedance. In addition, the control unit 168 may be connected to an external apparatus (not shown) such as a host computer so as to delegate the management of the control unit 168 to the external apparatus.

Prior to the execution of the specific type of processing, e.g., an etching process, on the wafer W, the gate valve 130 is set in the open state to carry the wafer W into the processing chamber 110 and once the wafer W is inside the processing chamber, it is placed onto the susceptor 112 at the plasma processing apparatus 100 in the embodiment structured as described above. Then, the DC voltage originating from the DC power source 142 is applied to the electrode 140a in the electrostatic chuck 140 so as to electrostatically hold the wafer W onto the susceptor 112.

Next, the processing gas (normally a mixed gas) from the processing gas supply unit 162, controlled to sustain predetermined flow rates and a predetermined flow rate ratio, is delivered into the processing chamber 110 and the pressure inside the processing chamber 110 is adjusted to a preset level via the exhaust device 128. Radio-frequency power with a predetermined power level is supplied to the susceptor 112 from the RF generator 132. The processing gas output through the showerhead 138 is raised to plasma as a radio-frequency discharge occurs between the upper electrode (the showerhead 138) and the lower electrode (the susceptor 112). The specific type of processing is then executed on the surface of the wafer W with radicals and ions contained in the plasma.

The radio-frequency power output from the RF generator 132 is transmitted to the susceptor 112 via the matcher 200 and the feeder rod 210. In the embodiment, the voltage probe 220V and the current probe 220I at the feeder rod 210 continuously measure respectively the voltage and the current of the radio-frequency power traveling through the rod-shaped conductive member 212 while the radio-frequency power is output from the RF generator 132 and the measurement data obtained via the probes are transmitted to the control unit 168.

Based upon the vaulted data and the current data received from the voltage probe 220V and the current probe 220I, the control unit 168 calculates various types of electrical characteristics such as the standing wave, the traveling wave and the reflected wave of the radio-frequency power supplied to the susceptor 112, the effective power and the load impedance (plasma impedance). Based upon these electrical characteristics, which reflect the state of plasma formed inside the processing chamber 110, the control unit 168 is able to accurately adjust the plasma parameters to optimize and stabilize the plasma. Such plasma parameters may include, for instance, the flow rate of the processing gas originating from the processing gas supply unit 162 and delivered into the processing chamber 110, the degree of vacuum achieved inside the processing chamber 110, the level of the radio-frequency power output from the RF generator 132 and the level of the capacitive reactance component at the matcher 200.

Once the plasma parameters are accurately adjusted by the control unit 168, optimal plasma is formed inside the processing chamber 110 and a stable optimized plasma state can be sustained. As a result, very precise etching can be executed on the wafer W.

(Structural Example for the Feeder Rod)

Figure 2:
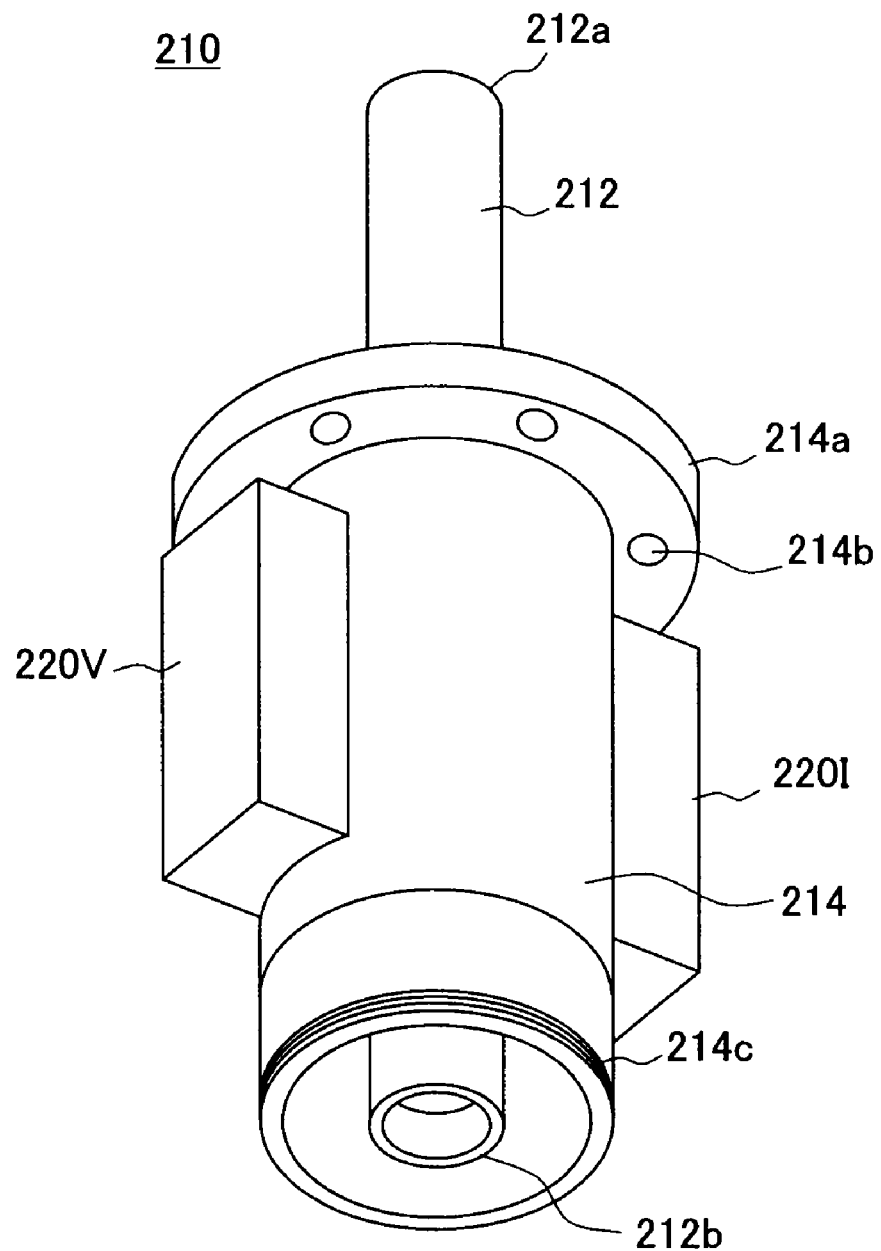
FIG. 2 is a perspective schematically illustrating a structural example that may be adopted in the feeder rod in the embodiment.
Figure 3:
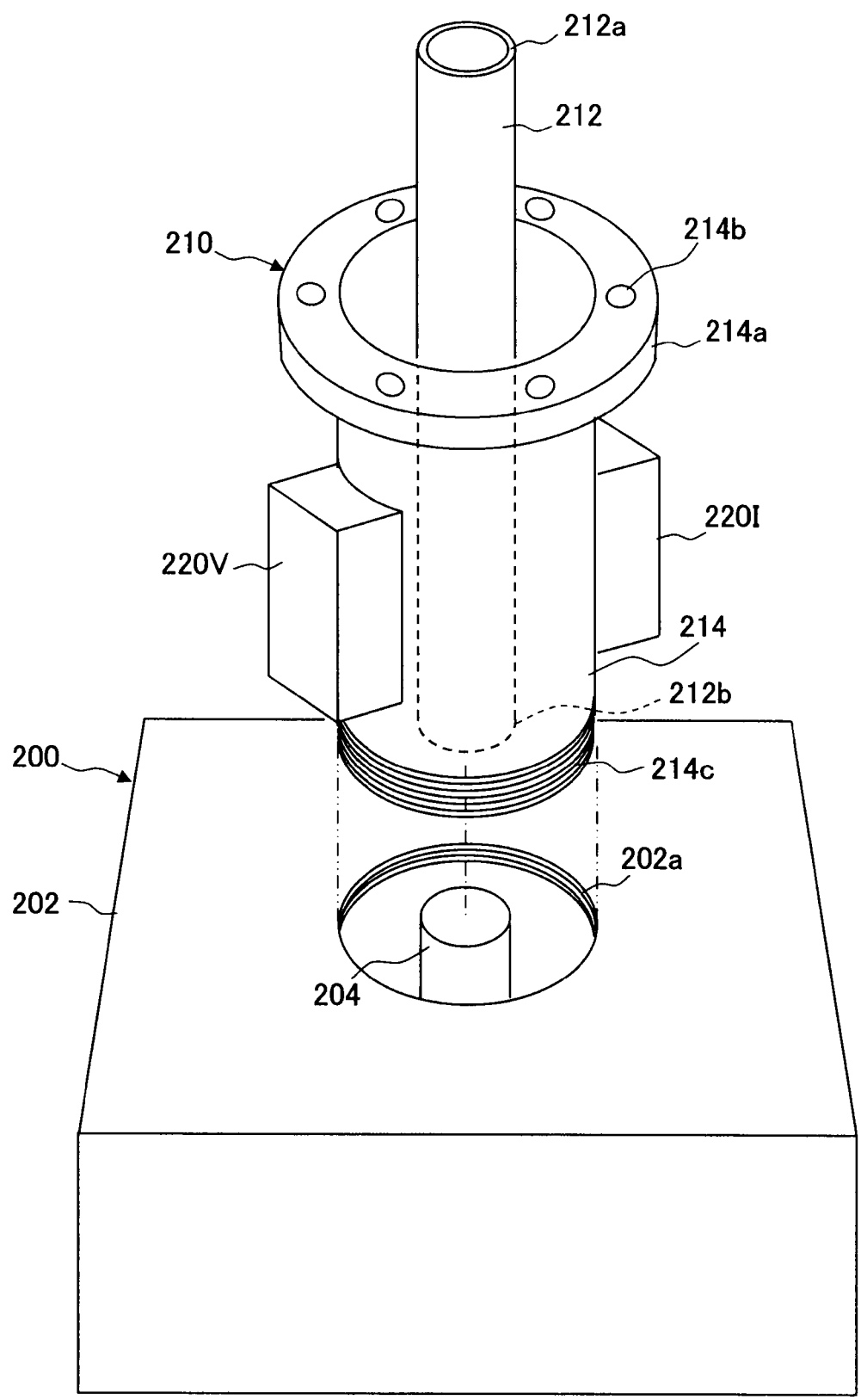
FIG. 3 is an assembly diagram providing a perspective of a specific example that may be adopted when connecting the feeder rod and the matcher in the embodiment.

Next, a structural example for the feeder rod 210 that may be adopted in the embodiment is described in further detail in reference to drawings. FIG. 2 is a perspective schematically illustrating the feeder rod 210 in the disengaged state. FIG. 3 is an assembly diagram in a perspective, illustrating specifically how the feeder rod 210 may be connected to the matcher 200. As shown in FIGS. 2 and 3, the feeder rod 210 in the embodiment includes as an integrated part thereof probes (the voltage probe 220V and the current probe 220I) used to measure the electrical characteristics of the radio-frequency power transmitted through the feeder rod. In other words, the feeder rod 210 in the embodiment is a probing feeder rod provided as a detachable integrated unit made up with the feeder rod and the probes. In addition, the feeder rod 210 adopts a coaxial double-pipe structure with the rod-shaped conductive member 212 inserted within the tubular conductive member 214 so as to align the axis of the rod-shaped conductive member 212 with the axis of the tubular conductive member 214. Although not shown in FIGS. 2 and 3, the rod-shaped conductive member 212 is fixed to the tubular conductive member 214 via the insulating members 216, as explained earlier, and thus, the entire feeder rod can be mounted or disengaged in a precision coaxial state while ensuring that the rod conductive member and the tubular conductive member are electrically insulated from each other.

As shown in FIG. 2, the voltage probe 220V and the current probe 220I are attached to the outer wall surface of the tubular conductive member 214. The voltage probe 220V and the current probe 220I may be in contact with the rod-shaped conductive member 212 when measuring the voltage and the current of the radio-frequency power transmitted through the rod-shaped conductive member 212, or they may measure the voltage and the current through noncontact measurement by measuring the electrostatic surface potential via the electrostatic capacity. In place of the voltage probe 220V and the current probe 220I, probes that measure the traveling wave power and the reflected wave power may be provided as an integrated part of the feeder rod 210.

The feeder rod (probing feeder rod) 210 achieved in the embodiment described above includes probes as an integrated part of the feeder rod via which the radio-frequency power originating from the RF generator 132 is transmitted to the susceptor 112 and the entire integrated unit can be connected or disconnected as a whole. Thus, the integrated probes have an advantage over the all-purpose probe unit in the related art in that they eliminate the need to divide the radio-frequency transmission path within the feeder rod or the matching circuit into two separate segments for purposes of probe insertion. While the issue of power loss caused by poor connection in the radio-frequency transmission path, an insufficient capacity over the connecting area or the like poses a considerable challenge in the related art, which requires a special mounting process to be performed to mount the probe unit, such power loss is prevented through the use of the integrated probes and, at the same time, any inconsistency among measurement values obtained from individual plasma processing apparatuses, attributable to inconsistent probe mounting positions, mounting errors or the like, can be eliminated. As a result, radio-frequency power sustaining its electrical characteristics substantially intact can be transmitted to the susceptor 112 inside the processing chamber 110 from the RF generator 132.

Next, in reference to drawings, a method that may be adopted when installing the feeder rod 210 in the plasma processing apparatus 100 is described. A method that may be adopted when connecting the feeder rod 210 to the processing chamber 110 is first explained. The feeder rod 210 may be detachably connected to the processing chamber 110 via a flange 214a formed at an upper end (one end) of the tubular conductive member 214 at the feeder rod 210. Such a flange 214a should be placed in contact with an outer wall surface 110a at the bottom of the processing chamber 110 so as to interlock fastening members such as bolts, inserted through a plurality of through holes 214b formed at the flange 214a, in screw holes (not shown) formed at the outer wall surface 110a. The feeder rod 210 can be thus accurately positioned relative to the processing chamber 110 and connected to the processing chamber 110 with ease. In addition, the level of electrical contact between the flange 214a and the outer wall surface 110a may be increased by disposing a conductive member (e.g., a conductive seal or a spiral seal) between the flange 214a and the outer wall surface 110a.

In addition, an upper end (one end) 212a of the rod-shaped conductive member 212 projects further out beyond the flange 214a formed at the upper end (one end) of the tubular conductive member 214. The extent to which the one end of the rod-shaped conductive member projects out beyond the flange should be set to match the length over which the upper end 212a of the rod-shaped conductive member 212 links with the radio-frequency input terminal (not shown) of the susceptor 112 as the feeder rod 210 is connected to the processing chamber 110 and the projecting portion of the rod-shaped conductive member 212 is placed within the processing chamber 110. This structural feature allows the upper end 212a of the rod-shaped conductive member 212 to become connected to the radio-frequency input terminal of the susceptor 112 simply by connecting the feeder rod 210 to the processing chamber 110.

The rod-shaped conductive member 212 may be a hollow member or a solid member. If the rod-shaped conductive member 212 is formed as a hollow member, i.e., a tubular member, the radio-frequency input terminal at the susceptor 112 may be fitted inside the hollow portion of the rod-shaped conductive member 212. In this case, too, a conductive member such as that mentioned earlier may be disposed between the rod-shaped conductive member 212 and the radio-frequency input terminal at the susceptor 112 to increase the level of electrical contact. This structure allows the rod-shaped conductive member 212 to easily and reliably become electrically connected with the susceptor 112 simply by connecting the feeder rod 210 to the processing chamber 110. Furthermore, the rod-shaped conductive member 212 can be easily disengaged from the susceptor 112 simply by disengaging the feeder rod 210 from the processing chamber 110.

It is to be noted that the rod-shaped conductive member 212 and the susceptor 112 may be connected through a method other than that described above. For instance, the rod-shaped conductive member 212 and the susceptor 112 may be detachably connected by interlocking a threaded area formed at the upper end 212a of the rod-shaped conductive member 212 in a screw hole formed at the radio-frequency input terminal at the susceptor 112. In such a case, the upper end 212a of the rod-shaped conductive member 212 may be first made to interlock with the susceptor 112 and then the flange 214a of the tubular conductive member 214 may be attached to the processing chamber 110 via fastening members such as bolts. Moreover, the rod-shaped conductive member 212 and the radio-frequency input terminal at the susceptor 112 may be attached to each other by fitting one into the other or the tubular conductive member 214 and the processing chamber 110 may be attached to each other by fitting one inside the other.

Next, a method that may be adopted when connecting the feeder rod 210 and the matcher 200 is explained. As shown in FIG. 3, the feeder rod may be detachably connected to the matcher by interlocking the lower end (other end) 212b of the rod-shaped conductive member 212 and the tubular conductive member 214 with the matcher 200. In such a case, the feeder rod and the matcher can be detachably connected by interlocking the thread formed at the lower end (other end) 214c of the tubular conductive member 214 in a screw hole 202a formed at a casing 202 of the matcher 200. As the feeder rod is inserted by interlocking the thread at the tubular conductive member 214 with the screw hole 202a at the matcher 200, the feeder rod 210 is easily connected to the matcher 200 at the intended position.

In addition, a radio-frequency output terminal 204 at the matcher 200 is formed so that it fits with the lower end 212b of the rod-shaped conductive member 212, which may be formed as a hollow member. This structural feature allows the lower end 212b of the rod-shaped conductive member 212 to form a reliable electrical connection with the radio-frequency output terminal 204 of the matcher 200 simply by connecting the feeder rod 210 to the matcher 200. In addition, the feeder rod 210 needs only to be disengaged from the matcher 200 to electrically disconnect the rod-shaped conductive member 212 from the radio-frequency output terminal 204 of the matcher 200.

It is to be noted that the radio-frequency output terminal 204 of the matcher 200 and the lower end 212b of the rod-shaped conductive member 212 may be connected through a method other than that described above. For instance, they may be detachably connected by interlocking the lower end 212*b* of the rod-shaped conductive member 212 with the radio-frequency output terminal 204 of the matcher 200. In such a case, they should be connected by interlocking the lower end 212*b* of the rod-shaped conductive member 212 with the radio-frequency output terminal 204 at the same time as the lower end 214*c* of the tubular conductive member 214 is made to interlock with the screw hole 202*a* at the matcher 200.

As described above, the feeder rod (probing feeder rod) 210 in the embodiment is an integrated unit made up with the rod-shaped conductive member 212 constituting the radio-frequency transmission path, the tubular conductive member 214 and the voltage probe 220V and the current probe 220I used for electrical characteristics measurement. The integrated unit as a whole can be detachably connected to the processing chamber 110 and the matcher 200 in the plasma processing apparatus 100.

Thus, while the feeder rod 210 may be installed in any of a plurality of plasma processing apparatuses 100, the electrical characteristics of the radio-frequency power transmitted through the rod-shaped conductive member 212 can always be measured under consistent conditions. Namely, the radio-frequency power electrical characteristics can always be measured accurately at the individual plasma processing apparatuses 100 via the voltage probe 220V and current probe 220I. As a result, plasma in a desirable state can be formed inside the processing chamber 110 and the plasma can be reliably sustained in the desirable state by adjusting the plasma parameters based upon the measurement data.

In addition, the feeder rod 210 in the embodiment may be attached to/detached from the matcher 200 alone. This means that the feeder rod 210 does not always need to be replaced when the matcher 200 is replaced, and thus, the data measurement environment in which the voltage and the current are measured via the voltage probe 220V and the current probe 220I is kept intact through matcher replacement. Consequently, even when the matcher 200 is replaced, the continuity in the measurement data provided by the probes can be maintained.

In addition, the rod-shaped conductive member 212 and the tubular conductive member 214 in the feeder rod 210 in the embodiment are coaxial to each other. As the feeder rod 210 is installed in the plasma processing apparatus 100, the casing of the processing chamber 110 and the casing 202 of the matcher 200 become reliably electrically connected via the tubular conductive member 214. As the radio-frequency power output from the RF generator 132 is supplied to the susceptor 112 and plasma is generated inside the processing chamber 110, the power from the RF generator 132 travels through a route including: the matcher 200, the rod-shaped conductive member 212, the susceptor 112, (lower electrode), plasma, the showerhead 138 (upper electrode), the casing of the processing chamber 110, the tubular conductive member 214, the casing 202 of the matcher 200 in this order before returning to the RF generator 132 and thus, a radio-frequency transmission path loop through which the radio-frequency power travels to the ground (ground potential) is formed.

In the embodiment, the returning radio-frequency circuit is not split at the tubular conductive member 214 and, as a result, an optimal radio-frequency transmission path loop is formed. Consequently, the extent to which the electrical characteristics of the radio-frequency power deteriorate through the radio-frequency transmission path is minimized and plasma can be generated efficiently in correspondence to the level of the power output from the RF generator 132. It is to be noted that while the voltage probe 220V and the current probe 220I are attached to the outer wall surface of the tubular conductive member 214, the areas over which they are attached are only part of the entire wall surface of the tubular conductive member 214. In other words, the extent to which the radio-frequency power becomes attenuated over these areas is insignificant and does not adversely affect the state of the plasma.

Furthermore, since the feeder rod (probing feeder rod) 210 in the embodiment can be disengaged as a whole, the measurement achieved via the probes can be calibrated for the probes constituting an integrated part of the feeder rod, i.e., in the state in which the probes are actually engaged in operation. For instance, instead of taking out the probes or the part of the feeder rod over which the probes are attached for purposes of calibration as in the related art, calibration can be performed for the probes remaining an integrated part of the feeder rod unit in the embodiment. Moreover, the calibration can be executed for the feeder rod with the probes constituting an integrated part thereof without disrupting the coaxial state in the feeder rod. This means that once the probing feeder rod is calibrated, the probing feeder rod only needs to be installed in the plasma processing apparatus to measure the electrical characteristics of the radio-frequency power via the probes in the calibrated state. As a result, the electrical characteristics can be measured with an even higher level of accuracy than in the related art. Since the plasma parameters can be adjusted with a higher level of precision based upon the measurement values measured with a high level of accuracy as described above, plasma in a more desirable state can be formed with better stability. A specific example of a calibration method that may be adopted is now described in detail.

(Calibration Method)

Figure 4:
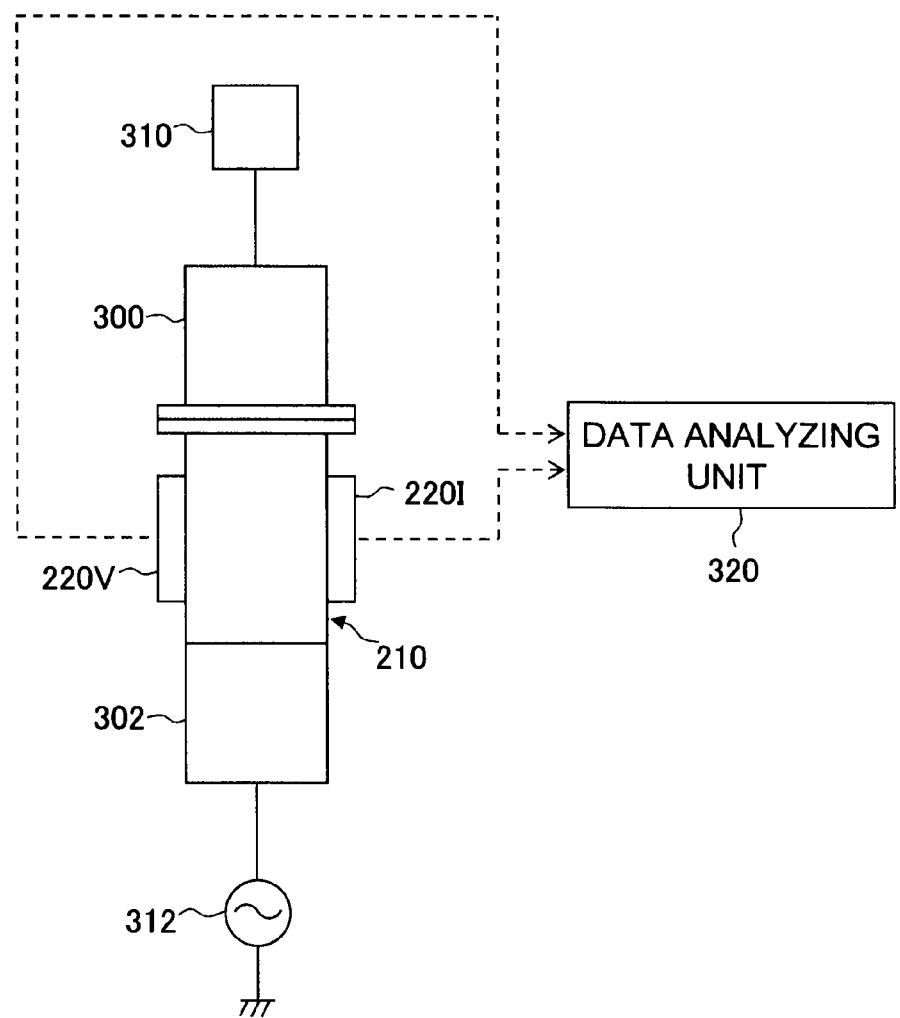
FIG. 4 is a diagram presenting a specific example that may be adopted to create the simulation environment in which the radio-frequency power measurement system in the embodiment is calibrated.

In reference to a drawing, a calibration method that may be adopted to calibrate the measurement system, which includes the voltage probe 220V and the current probe 220I, is described. FIG. 4 shows how the simulation environment in the embodiment, in which the radio-frequency measurement system is calibrated, may be configured. As described earlier, the voltage probe 220V and the current probe 220I constitute an integrated part of the feeder rod 210 in the embodiment and the feeder rod 210 as a whole can be detachably installed into the plasma processing apparatus 100. Thus, the simulation environment shown in FIG. 4 is configured by using the entire feeder rod 210 instead of the voltage probe 220V and the current probe 220I alone.

In a simulation environment configured by using the entire feeder rod 210 as described above, the radio-frequency measurement system can be calibrated under conditions equivalent to the conditions in the actual plasma processing apparatus 100 and thus, a very precise calibration is assured.

In more specific terms, the simulation environment is configured as follows. Namely, one end (the end connected to the processing chamber 110) of the feeder rod 210 is connected to a dummy load unit 310 via an adapter (calibration jig) 300. Even more specifically, a first adapter (first calibration jig) 300 can be detachably connected to the flange 214*a* at the upper end of the tubular conductive member 214 and the upper end 212*a* of the rod-shaped conductive member 212. In addition, the other end (the end connected to the matcher 200) of the feeder rod 210 is connected to an RF generator 312 via a second adapter (second calibration jig) 302. Such an adapter (calibration jig) 302 may be detachably connected to the lower end 214*c* of the tubular conductive member 214 and the lower end 212*b* of the rod-shaped conductive member 212. A data analyzing unit 320 engaged in analysis of measurement data provided via the voltage probe 220V and the current probe 220I is connected to the individual probes.

The cable, the measuring instruments and the like constituting a radio-frequency circuit are normally designed to assume a characteristic impedance of 50Ω. Accordingly, the feeder rod 210 in the embodiment is also designed so as to assume a characteristic impedance of 50Ω. As a result, the simulation environment shown in FIG. 4 can be configured without having to factor in the need for impedance matching in the radio-frequency transmission path and the radio-frequency measurement system can be calibrated more easily.

The radio-frequency measurement system is calibrated in the simulation environment shown in FIG. 4 as follows. First, the dummy load unit 310 constituted with a fixed resistance unit assuming a characteristic impedance of 50Ω matching the characteristic impedance in the radio-frequency transmission path is connected to the first adapter 300. Then, radio-frequency power with a predetermined power level, e.g., 100 W, is output from the RF generator 312 by varying its frequency within a range of, for instance, 1 MHz to 500 MHz.

As the frequency of the radio-frequency power traveling through the rod-shaped conductive member 212 is varied as described above, the voltage and the current of the radio-frequency power are measured via the voltage probe 220V and the current probe 220I. Based upon the measurement data provided from the probes, the data analyzing unit 320 determines through calculation the load impedance, i.e., the impedance at the dummy load unit 310. Then, the difference between the calculation results and the actual impedance (50Ω in the embodiment) at the dummy load unit 310 is designated as a load impedance calibration value related to the frequency of the radio-frequency power.

It is desirable to obtain calibration values by setting the load impedance at 0Ω, i.e. by grounding the output end of the first adapter 300 and also by setting the load impedance to ∞Ω (infinite ohm), i.e., by leaving the output end of the first adapter 300 in the open state, in addition to the calibration value obtained via the 50Ω fixed resistance unit as described above. A calibration value should also be obtained by assuming the load impedance of the actual plasma, i.e., by using a load unit that holds a reactance component as the dummy load unit 310. Through the embodiment in which calibration values are obtained by using various loads, the radio-frequency measurement system can be calibrated more accurately.

Subsequently, any error contained in the measurement data provided via the voltage probe 220V and the current probe 220I by measuring the voltage and the current of the radio-frequency power flowing through the rod-shaped conductive member 212 in the feeder rod 210 installed in the actual plasma processing apparatus 100 can be eliminated in an optimal manner. As a result, the electrical characteristics of the radio-frequency power supplied to the susceptor 112 can be ascertained accurately, which, in turn, makes it possible to form plasma in a desirable state within the processing chamber 110 and sustain the desirable plasma state with better stability.

(Application in Another Plasma Processing Apparatus)

Figure 5:
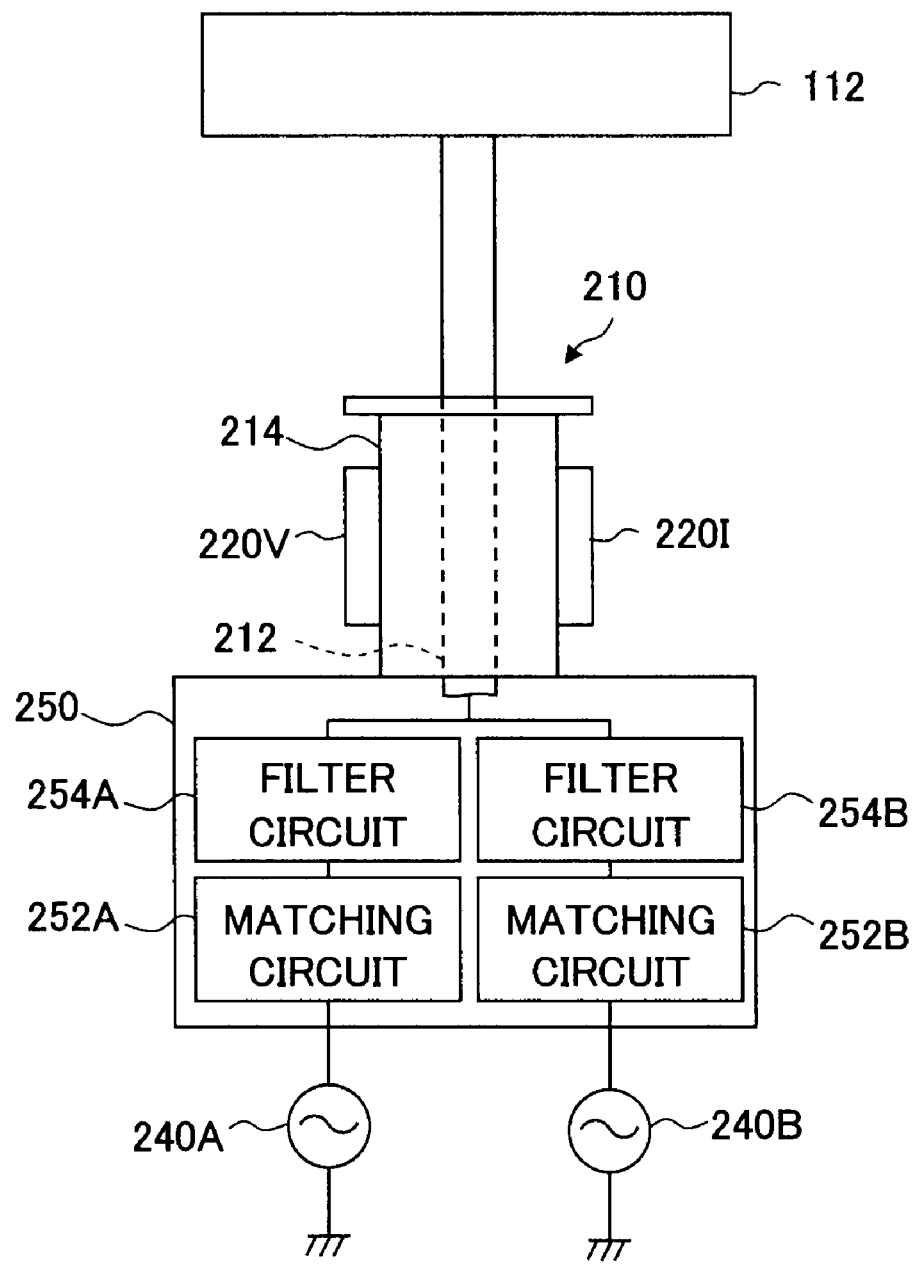
FIG. 5 is a block diagram schematically illustrating the structure adopted in the radio-frequency circuit in another plasma processing apparatus that may adopt the present invention.

Next, in reference to a drawing, an example in which the feeder rod 210 described above is adopted in another plasma processing apparatus is described. FIG. 5 is a block diagram schematically illustrating the radio-frequency circuit in the alternative plasma processing apparatus. Through this radio-frequency circuit, radio-frequency power (hereafter referred to as a "superimposed wave") obtained by superimposing a plurality of (two in this example) radio-frequency power waves one on top of another is supplied to the susceptor 112.

The radio-frequency circuit shown in FIG. 5 includes a first RF generator 240A that outputs first radio-frequency power (e.g., plasma generation radio-frequency power) with a first frequency, a second RF generator 240B that outputs second radio-frequency power (e.g., bias voltage control radio-frequency power) with a second radio-frequency lower than the first frequency, and a matcher 250. The first frequency may be set to, for instance, 100 MHz, whereas the second frequency may be set to, for instance, 3.2 MHz. It is to be noted that while FIG. 5 does not include a detailed illustration of the internal structure of the processing chamber, the stage disposed inside the processing chamber and the like for purposes of simplification, the radio-frequency circuit includes structural elements similar to those shown in FIG. 1 in addition to the matcher 250 and the RF generators 240A and 240B.

The matcher 250 is equipped with internal components such as a first matching circuit 252A and a first filter circuit 254A connected in series and a second matching circuit 252B and a second filter circuit 254B connected in series. An input terminal of the first matching circuit 252A is connected to the first RF generator 240A, whereas an input terminal of the second matching circuit 252B is connected to the second RF generator 240B. An output terminal of the first filter circuit 254A and an output terminal of the second filter circuit 254B are both connected to the rod-shaped conductive member 212 in the feeder rod 210. In addition, the casing of the matcher 250 is connected to the tubular conductive member 214 in the feeder rod 210. It is to be not that the matching circuit 252A and 252B may assume structures similar to that of the matching circuit in the matcher 200 shown in FIG. 1.

The first filter circuit 254A prevents the second radio-frequency power from flowing into the first matching circuit 252A and the first matching circuit 252A matches the impedance of the first radio-frequency power at the susceptor 112 with the impedance of the first radio-frequency power at the first RF generator 240A. The second filter circuit 254B prevents the first radio-frequency power from flowing into the second matching circuit 252B and the second matching circuit 252B matches the impedance of the second radio-frequency power at the susceptor 112 with the impedance of the second radio-frequency power at the second RF generator 240B.

Via this radio-frequency circuit, the superimposed wave obtained by superimposing the first radio-frequency power with the 100 MHz frequency and the second radio-frequency power with the 3.2 MHz frequency one on top of the other, is supplied to the susceptor 112 via the feeder rod 210. When a superimposed wave obtained by superimposing a plurality of radio-frequency power waves is supplied to the susceptor 112 as in this case, too, the superimposed radio-frequency power can be transmitted via a single integrated feeder rod (probing feeder rod) 210, which includes the feeder rod and the probes constituting an integrated part thereof and can be connected/disconnected as a whole, so as to minimize the extent of deterioration of the electrical characteristics of the radio-frequency power transmitted via the feeder rod. In addition, the measurement values indicating the electrical characteristics can be calibrated for the integrated unit made up with the feeder rod and the probe. This allows the electrical characteristics to be measured with a higher level of accuracy over the related art and the radio-frequency power sustaining its electrical characteristics substantially intact can be transmitted to the electrode inside the processing chamber from the RF generators. Consequently, the optimal plasma can be formed inside the processing chamber 110 and the desirable plasma state can be maintained with stability.

Figure 6:
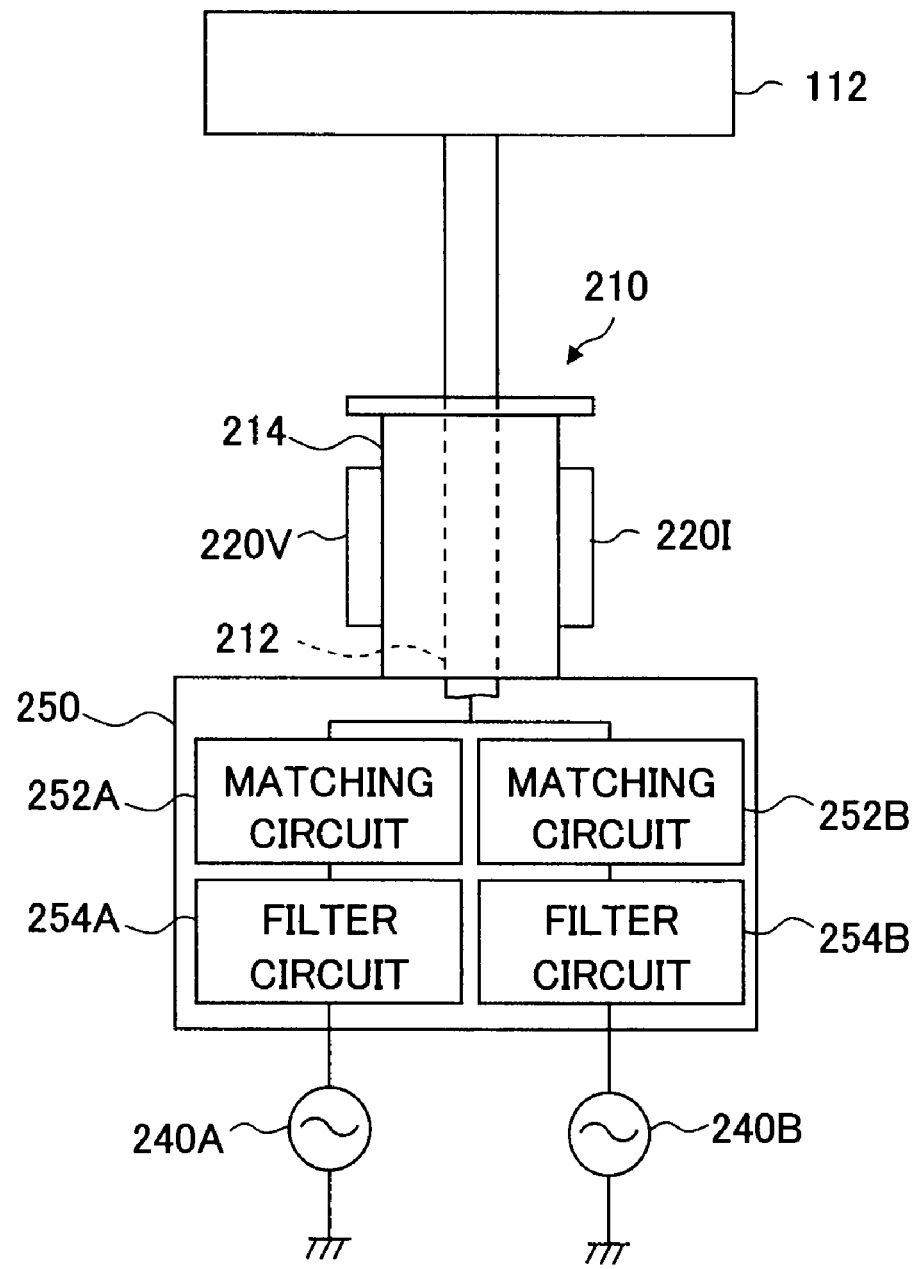
FIG. 6 is a block diagram presenting another structural example that may be adopted in the radio-frequency circuit in FIG. 5.

In addition, the positional arrangement that may be assumed for the first and second filters 254A and 254B and the first and second matching circuits 252A and 252B is not limited to that shown in FIG. 5 and the positional relationship between the first filter 254A and the first matching circuit 252A and between the second filter 254B and the second matching circuit 252B may be reversed, as shown in FIG. 6. Namely, the first filter 254A may be disposed between the first matching circuit 252A and the first RF generator 240A and the second filter 254B may be disposed between the second matching circuit 252B and the second RF generator 240B.

It is to be noted that the plasma generation radio-frequency power is applied to the susceptor 112 (lower electrode) in the plasma processing apparatus 100 having been explained earlier in reference to the embodiment. However, the present invention is not limited to this example and it may be adopted in a plasma processing apparatus in which the plasma generation radio-frequency power is supplied to, for instance, the showerhead 138 (upper electrode), instead. By adopting the present invention in such a plasma processing apparatus, the electrical characteristics of the radio-frequency power supplied to the showerhead 138 can be measured with a high level of accuracy.

Furthermore, the feeder rod (probing feeder rod) 210 in the embodiment can be disengaged as a whole. This means that the integrated unit made up with the feeder rod and the probes can be used in inspection (shipping inspection) to determine whether or not electrical characteristics measurement values, obtained by measuring the electrical characteristics via the probes in the actual operating state with the calibration jigs mentioned earlier attached to the two ends of the feeder rod unit, are within allowable ranges. As a result, accurate shipping inspection can be performed for the feeder rod 210.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

What is claimed is:

1. A plasma processing apparatus, comprising:
a processing chamber where a specific type of plasma processing is executed on a substrate by using a gas raised to plasma;
a plasma generation electrode used to generate plasma, which is disposed within said processing chamber;
a plurality of RF generators that generate radio-frequency power with different frequencies;
a matcher that includes a plurality of matching circuits each disposed between said electrode and one of said RF generators, set away from said processing chamber, and engaged in impedance matching to match an input impedance at said electrode with an output impedance at the corresponding RF generator; and
a probing feeder rod constituted as an integrated unit that includes a plurality of probes used in an electrical characteristics measurement and provided as an integrated part of a feeder rod via which superimposed radio-frequency power obtained by superimposing radio-frequency power with different frequencies having been generated at said RF generators and having traveled through said matching circuits, is transmitted and supplied to said electrode, wherein:
said probing feeder rod adopts a coaxial double-pipe structure that includes, a single rod-shaped conductive member detachably connected between a radio-frequency output terminal of said matcher and said electrode, and a tubular conductive member detachably connected at a ground potential between said matcher and a bottom portion of said processing chamber so as to enclose an exterior of said rod-shaped conductive member between said matcher and a bottom portion of said processing chamber,
wherein the tubular conductive member has a flange connecting to the bottom of the processing chamber through a conductive seal and the tubular conductive member is fixedly spaced from the rod-shaped conductive member through disk shaped insulators, the rod-shaped conductive member having a length so that when the tubular conductive member attaches to the bottom of the chamber the rod-shaped conductive member electrically contacts to the plasma generation electrode and to said matcher, at least one of said plurality of probes is attached to an outer wall surface of said tubular conductive member as an integrated part of the feeder rod without dividing said rod- shaped conductive member and said tubular conductive member into separate parts,
said probing feeder rod is detachably mounted between said matcher and said processing chamber.

2. The plasma processing apparatus according to claim 1, wherein:
said probe is capable of measuring electrical characteristics representing one of; the voltage, the current, the effective power, a traveling wave, a reflected wave and the load impedance, of radio-frequency power transmitted through said feeder rod via said probe or is capable of simultaneously measuring electrical characteristics representing two or more among; the voltage, the current, the effective power level, the traveling wave, the reflected wave and the load impedance of radio-frequency power transmitted through said feeder rod via said probe.

3. The plasma processing apparatus according to claim 1, wherein:
one end of said probing feeder rod connected on said processing chamber side can be freely attached to/detached from a dummy load via a first calibration jig, and another end of said probing feeder rod connected to said matcher side can be freely attached to/detached from said RF generator via a second calibration jig; and
said probing feeder rod, with said probe remaining an integrated part thereof is connected between said dummy load and said RF generator when measurement via said probe is calibrated.

4. The plasma processing apparatus according to claim 1, wherein:
said probing feeder rod is structured to assume a characteristic impedance of 50Ω.

5. The plasma processing apparatus according to claim 1, wherein:
a filter circuit that allows power assuming a predetermined frequency alone to pass through is installed at a radio-frequency output terminal of each of said matching circuits.

6. A feeder rod that transmits via a matcher radio-frequency power to an electrode used for plasma generation, disposed within a processing chamber where a specific type of plasma processing is executed on a substrate, wherein:
said feeder rod comprising:
a coaxial double-pipe structure that includes, a single rod-shaped conductive member detachably connected between a radio-frequency output terminal of a matcher and said electrode, and a tubular conductive member detachably connected at a ground potential between said matcher and a bottom portion of said processing chamber so as to enclose an exterior of said rod-shaped conductive member between said matcher and a bottom portion of said processing chamber, wherein the tubular conductive member has a flange connecting to the bottom of the processing chamber through a conductive seal and the tubular conductive member is fixedly spaced from the rod-shaped conductive member through disk shaped insulators, the rod-shaped conductive member having a length so that when the tubular conductive member attaches to the bottom of the chamber the rod-shaped conductive member electrically contacts to a plasma generation electrode and to said matcher, a probe used in an electrical characteristics measurement is attached to an outer wall surface of said tubular conductive member as an integrated part of the feeder rod without dividing said rod-shaped conductive member and said tubular conductive member into separate parts, and the entire integrated unit including said feeder rod and said probe is detachably mounted between said matcher and said processing chamber.

7. The feeder rod according to claim 6, wherein:

one end of said feeder rod connected on said processing chamber side can be freely attached to/detached from a dummy load via a first calibration jig, and another end of said feeder rod connected to said matcher side can be freely attached to/detached from an RF generator via a second calibration jig; and said feeder rod, with said probe remaining an integrated part thereof is connected between said dummy load and said RF generator when measurement via said probe is calibrated.

* * * * *